United States Patent
Wu et al.

(10) Patent No.: US 12,170,123 B2
(45) Date of Patent: Dec. 17, 2024

(54) MEMORY TEST CIRCUIT, MEMORY ARRAY, AND TESTING METHOD OF MEMORY ARRAY

(71) Applicant: Taiwan Semiconductor Manufacturing Company, Ltd., Hsinchu (TW)

(72) Inventors: Jui-Jen Wu, Hsinchu (TW); Jen-Chieh Liu, Hsinchu (TW); Yi-Lun Lu, New Taipei (TW); Win-San Khwa, Taipei (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 127 days.

(21) Appl. No.: 17/901,801

(22) Filed: Sep. 1, 2022

(65) Prior Publication Data

US 2024/0079080 A1 Mar. 7, 2024

(51) Int. Cl.
*G11C 29/50* (2006.01)
*G11C 7/24* (2006.01)
*G11C 29/12* (2006.01)
*G11C 29/46* (2006.01)

(52) U.S. Cl.
CPC .............. *G11C 29/46* (2013.01); *G11C 7/24* (2013.01); *G11C 29/1201* (2013.01); *G11C 29/12015* (2013.01); *G11C 2029/1202* (2013.01); *G11C 2029/1204* (2013.01); *G11C 2029/1206* (2013.01); *G11C 2029/5002* (2013.01)

(58) Field of Classification Search
CPC ....... G11C 29/46; G11C 7/24; G11C 29/1201; G11C 29/12015; G11C 2029/1202; G11C 2029/1204; G11C 2029/1206; G11C 2029/5002

See application file for complete search history.

(56) References Cited

U.S. PATENT DOCUMENTS 5,790,459 A * 8/1998 Roohparvar ........... G11C 16/12
365/185.23

* cited by examiner

*Primary Examiner* — Jay W. Radke
(74) *Attorney, Agent, or Firm* — JCIPRNET

(57) ABSTRACT

A memory test circuit is provided. The memory test circuit is disposed in a memory array and including: a test array, including test cells out of memory cells of the memory array; a write multiplexer, configured to selectively output one of a test signal and a reference voltage based on a write measurement signal, wherein the test signal is output to write into at least one test cell and the reference voltage is output to a sense amplifier; and a read multiplexer, configured to selectively receive and output one of a readout signal corresponding to the test signal and an amplified signal based on a read measurement signal, wherein the readout signal is read from the at least one test cell and the amplified signal is obtained for a read margin evaluation from the sense amplifier by amplifying a voltage difference between the readout signal and the reference voltage.

20 Claims, 5 Drawing Sheets

MEMORY TEST CIRCUIT, MEMORY ARRAY, AND TESTING METHOD OF MEMORY ARRAY

BACKGROUND

Memory devices are widely used for storing information in a variety of applications. To make sure the stored information is correct, the reliability of the memory device is important. For the evaluation of the reliability of the memory device and the development of the memory device, obtaining certain amount of cell characterization of the memory cells of the memory device is necessary.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
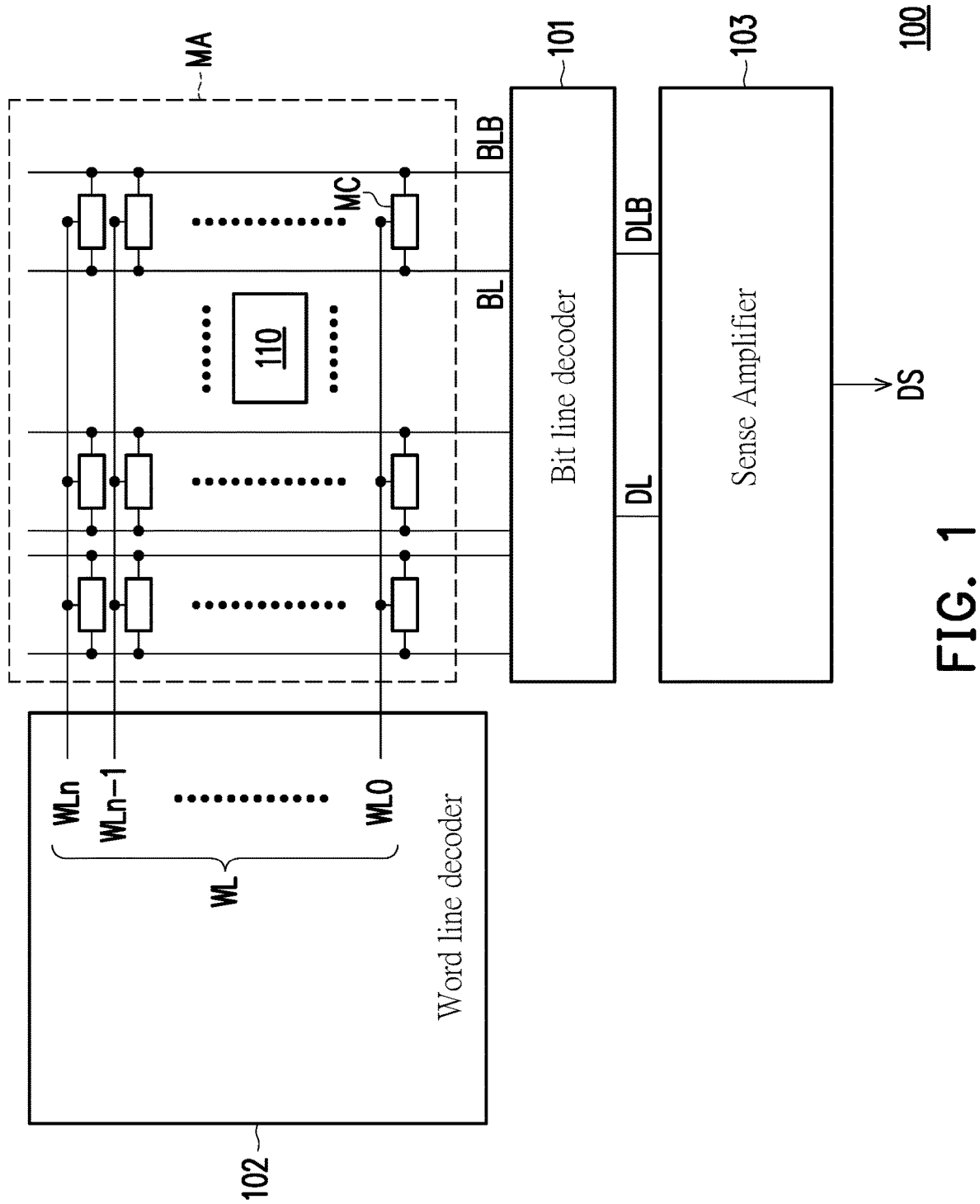
FIG. 1 is a schematic diagram illustrating a memory circuit in accordance with some embodiments of the present disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

FIG. 1 is a schematic diagram illustrating a memory circuit in accordance with some embodiments of the present disclosure. Referring to FIG. 1, the memory circuit 100 includes a memory array MA, a bit line decoder 101, a word line decoder 102, a sense amplifier 103, and a test array 110. The memory array MA includes memory cells MC, word lines WL, and bit lines BL, BLB. Each memory cell MC includes at least one access transistor (not shown). The word lines WL (i.e., WL0, . . . , WLn−1, WLn) are respectively coupled to a row of the memory cells MC. The bit lines BL, BLB are respectively coupled to a column of the memory cells MC. The sense amplifier 103 is coupled to the bit line decoder 101 through a first data line DL and a second data line DLB. The test array 110 includes a plurality of test cells out of the plurality of memory cells MC of the memory array MA.

In one embodiment, the bit line decoder 101 is used to select the voltage signals from the bit lines BL, BLB according to a second address signal (e.g., column selection signal) and output the decoded voltage signals to the first data line DL and the second data line DLB. The word line decoder 102 is used to select the word lines WL according to a first address signal (e.g., row selection signal). The sense amplifier SA is used to detect a voltage difference between the bit lines BL, BLB. The voltage signals of the bit lines BL, BLB are transmitted to the bit line decoder 101 and then the voltage signals of the bit lines BL, BLB are decoded to be data signals. The decoded data signals on the first data line DL and the second data line DLB may lead to a voltage difference between the first data line DL and the second data line DLB, and then the voltage difference between the first data line DL and the second data line DLB will be transmitted to the inputs of the sense amplifier SA. The sense amplifier SA senses the voltage difference between voltage inputs through the first data line DL and the second data line DLB and then outputs a sensing voltage at an output terminal of the sense amplifier circuit related to the read data.

In one exemplary embodiment, the bit lines BL, BLB are attached (electrically coupled) to the sense amplifier (sense amplifier circuits) SA at the edge of the memory array MA. In some embodiments, the bit lines BL, BLB are attached (electrically coupled) to the bit line decoder 101, and the sense amplifier SA is attached (electrically coupled) to the bit line decoder 101 through the data lines, for example, the first data line DL and the second data line DLB. As shown in FIG. 1, the memory cells MC located in the same column may be electrically coupled to the sense amplifier SA using two complementary bit lines BL, BLB.

In some embodiments, the sense amplifier SA is configured to compare voltages on the associated bit lines BL, BLB, and output a readout signal indicating the data stored in a selected memory cell MC during a read operation. In addition, the amplification and readout functions are integrated as one circuit in the sense amplifier SA. In such embodiment, the memory cells MC in the memory array MA are for example, static random access memory (SRAM) type memory cells. In some embodiments, the memory cells MC in the memory array MA are a series of six-transistor SRAM (6T-SRAM). The 6T-SRAM is the SRAM structure of this embodiment, and those who use this embodiment can adjust the number of transistors in the SRAM according to their needs, so as to realize the function of the SRAM. However, the disclosure is not limited thereto.

Moreover, the memory cells MC may further include a first access transistor. A gate terminal of the first access transistor is connected to a word line WL. In addition, a source/drain terminal of the first access transistor is coupled to a first storage node, while the other source/drain terminal of the first access transistor is connected to bit line BL. When the first access transistor is enabled, the bit line BL can charge/discharge the first storage node, or vice versa. Accordingly, logic data can be programmed to the first storage node, or read out from the first storage node. On the other hand, when the first access transistor is in an off state, the first storage node is decoupled from the bit line BL, and logic data cannot be written to or read out from the first storage node. In other words, the first access transistor may control access of the first storage node.

Similarly, access of a second storage node is controlled by a second access transistor. The word line WL for controlling switching of the second access transistor may also be connected to a gate terminal of the second access transistor. In this way, the first access transistor and the second access transistor may be switched simultaneously. In addition, a source/drain terminal of the second access transistor is coupled to the second storage node, while the other source/drain terminal of the second access transistor is connected to a bit line BLB. When the second access transistor is enabled, the bit line BLB can charge/discharge the second storage node, or vice versa. Accordingly, logic data can be programmed to the second storage node, or read out from the second storage node. On the other hand, when the second access transistor is in an off state, the second storage node is decoupled from the bit line BLB, and logic data cannot be written to or read out from the second storage node. During a write operation, the bit lines BL, BLB may receive complementary logic data, in order to overwrite the logic data previously stored at the first storage node and the second storage node. In addition, during a read operation using the sense amplifier SA, both of the bit lines BL, BLB are pre-charged, and one of them is slightly pulled down by the corresponding storage node. By comparing voltage difference of the bit lines BL, BLB, the logic data stored at the first storage node and the second storage node can be read out easily using the sense amplifier SA.

It is noted that, to make sure the stored information is correct, the reliability of the memory device is important. For the evaluation of the reliability of the memory device and the development of the memory device, obtaining certain amount of cell characterization of the memory cells of the memory device is necessary.

In the embodiment, the test array 110 is disposed in the memory array MA. The test array 110 includes the plurality of test cells out of the plurality of memory cells MC of the memory array MA. In one embodiment, the test array 110 may be a 16×16 cell array (i.e., being composed of 256 test cells), but the size of the test array (the number of the test cells) is not limited thereto. By performing write operations and read operations to the test cells of the test array 110, certain amount of cell characterization of the test cells may be obtained. Based on the cell characterization of the test cells of the test array 110, the cell characterization of the memory array MA may be obtained and thereby ensuring the reliability of the memory array MA.

In one embodiment, the memory cell MC includes, for example, NAND flash memory cells, NOR flash memory cells, Static Random Access Memory (SRAM) cells, Dynamic Random Access Memory (DRAM) cells, Magnetoresistive Random Access Memory (MRAM) cells, Phase Change Memory (PCM) cells, Resistive Random Access Memory (ReRAM) cells, 3D XPoint memory cells, ferroelectric random-access memory (FeRAM) cells, and other types of memory cells that are suitable for use within the memory array MA. This disclosure is not limited thereto.

Figure 2:
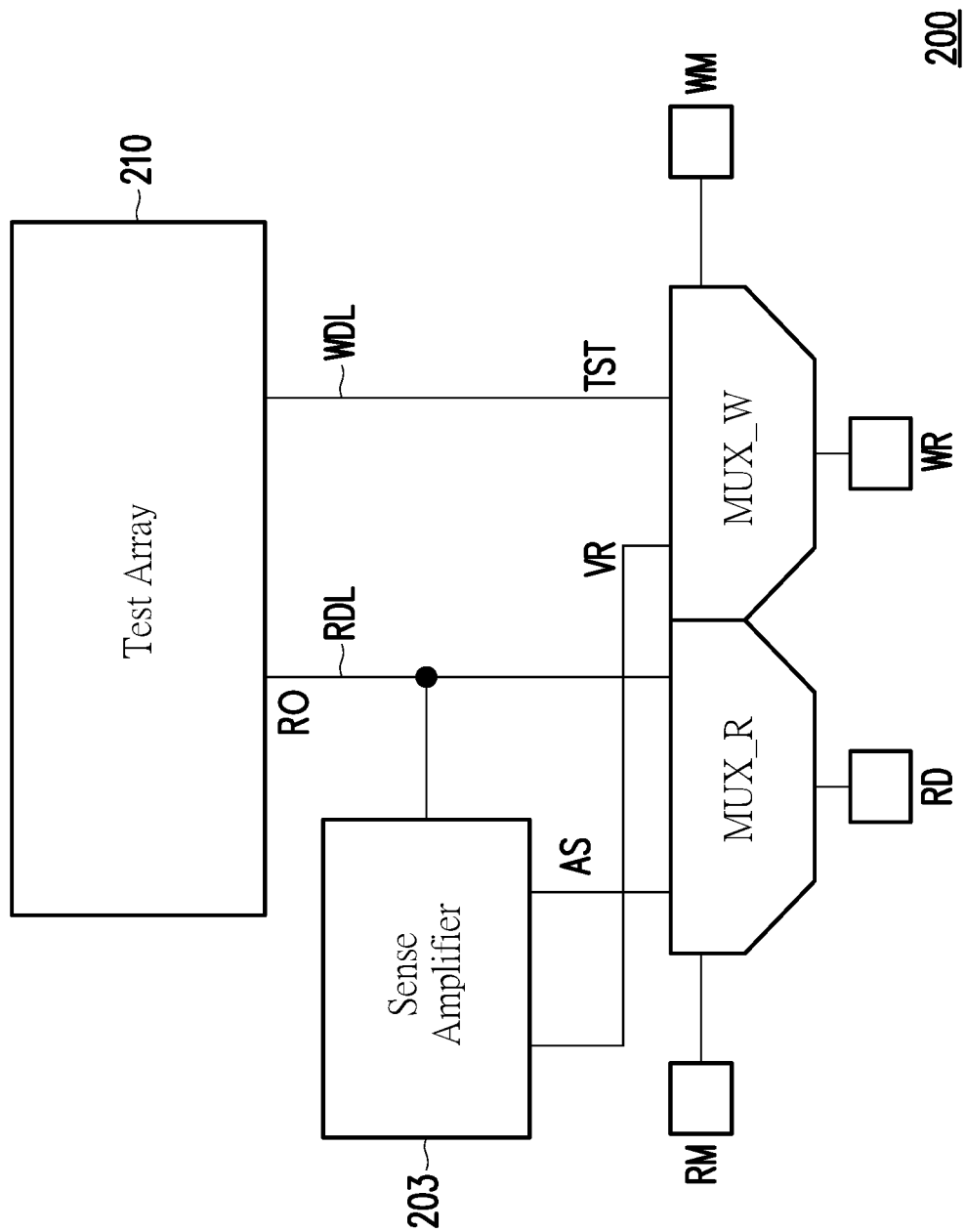
FIG. 2 is a schematic diagram of a memory test circuit in accordance with some embodiments of the present disclosure.

FIG. 2 is a schematic diagram of a memory test circuit in accordance with some embodiments of the present disclosure. Referring to FIG. 1 and FIG. 2, the memory test circuit 200 includes a test array 210, a write multiplexer MUX_W, and a read multiplexer MUX_R. The test array 210 includes the plurality of test cells out of the plurality of memory cells MC of the memory array MA. The write multiplexer MUX_W is electrically coupled to the test array though a write data line. The read multiplexer MUX_R is electrically coupled to the test array though a read data line. In one embodiment, the write multiplexer MUX_W and the read multiplexer MUX_R are electrically coupled to the test array 210 by the bit line decoder 101 of the memory array MA, but the disclosure is not limited thereto. In another embodiment, the write multiplexer MUX_W and the read multiplexer MUX_R are electrically coupled to the test array 210 by a built-in bit line decoder of the test array 210 or a built-in bit line decoder of memory test circuit 200.

The write multiplexer MUX_W includes one input terminal, one control terminal, and two output terminals. The write multiplexer MUX_W is configured to selectively output one of a test signal TST and a reference voltage VR based on a write measurement signal WM received by the control terminal. The test signal TST is output to write into at least one of the plurality of test cells of the test array 210 and the reference voltage VR is output to a sense amplifier 203. In one embodiment, when the write measurement signal WM is at a low voltage level (i.e., logic value 0), the write multiplexer MUX_W receives the test signal and output the test signal to the test array 210 to write data into the at least one of the plurality of test cells of the test array 210. In another embodiment, when write measurement signal WM is at a high voltage level (i.e., logic value 1), the write multiplexer MUX_W outputs the reference voltage VR to the sense amplifier 203.

Similarly, the write multiplexer MUX_R includes two input terminals, one control terminal, and one output terminal. The read multiplexer MUX_R is configured to selectively receive and output one of a readout signal RO corresponding to the test signal TST and an amplified signal AS based on a read measurement signal RM received by the control terminal. The readout signal RO is read from the at least one of the plurality of test cells of the test array 210 and the amplified signal AS is obtained from the sense amplifier 203 for a read margin evaluation. In one embodiment, the sense amplifier 203 may be same as the sense amplifier 103, but the disclosure is not limited thereto. In another embodiment, the sense amplifier 203 may be a built-in sense amplifier of the test array 210 or a built-in sense amplifier of memory test circuit 200. In one embodiment, when the read measurement signal RD is at a low voltage level (i.e., logic value 0), the read multiplexer MUX_R receives and outputs the readout signal RO from the at least one of the plurality of test cells of the test array 210. In another embodiment, when read measurement signal RD is at a high voltage level (i.e., logic value 1), the read multiplexer MUX_R receives the amplified signal AS from the sense amplifier 203

The sense amplifier 203 is configured to receive the readout signal RO from the at least one of the plurality of test cells of the test array 210, receive the reference voltage VR from the write multiplexer MUX_W, and output the amplified signal AS. The amplified signal is obtained for the read margin evaluation by amplifying a voltage difference between the readout signal RO and the reference voltage VR. In this manner, the state of the at least one of the plurality of test cells of the test array 210 is read out by the sense amplifier 203 for the read margin evaluation of the at least one of the plurality of test cells. By providing a plurality of test signals TST to the test array 210, the cell characterization of the plurality of test cell of the test array 210 may be obtained. Based on the cell characterization of the test cells of the test array 110, the cell characterization of the memory array MA may be obtained and thereby ensuring the reliability of the memory array MA.

In one embodiment, the test signal TST is provided from a controller to the write multiplexer MUX_W and the amplified signal AS is output from the read multiplexer MUX_R to the controller for the read margin evaluation. In one embodiment, the controller includes, for example, a microcontroller unit (MCU), a central processing unit (CPU), a microprocessor, a digital signal processor (DSP), a programmable controller, a programmable logic device (PLD), other similar devices, or a combination of the devices. The disclosure is not limited thereto. In addition, in an embodiment, each of functions of the controller may be achieved as multiple program codes. The program codes are stored in a memory, and executed by the controller. Alternatively, in an embodiment, each of the functions of the controller may be achieved as one or more circuits. The disclosure does not limit the use of software or hardware to achieve the functions of the controller.

It is noted that, the plurality of test cells of the test array 210 may also act as normal memory cells MC of the memory array MA by setting the write measurement signal WM and the read measurement signal RM. That is, the plurality of test cells of the test array 210 may provide not only a function of data storage, but also a function of cell characterization measurement. In other words, for the realization of the cell characterization measurement of the memory cells MC of the memory array MA, a huge amount of area is not needed and thereby saving the area overhead of the memory circuit 100.

Figure 3:
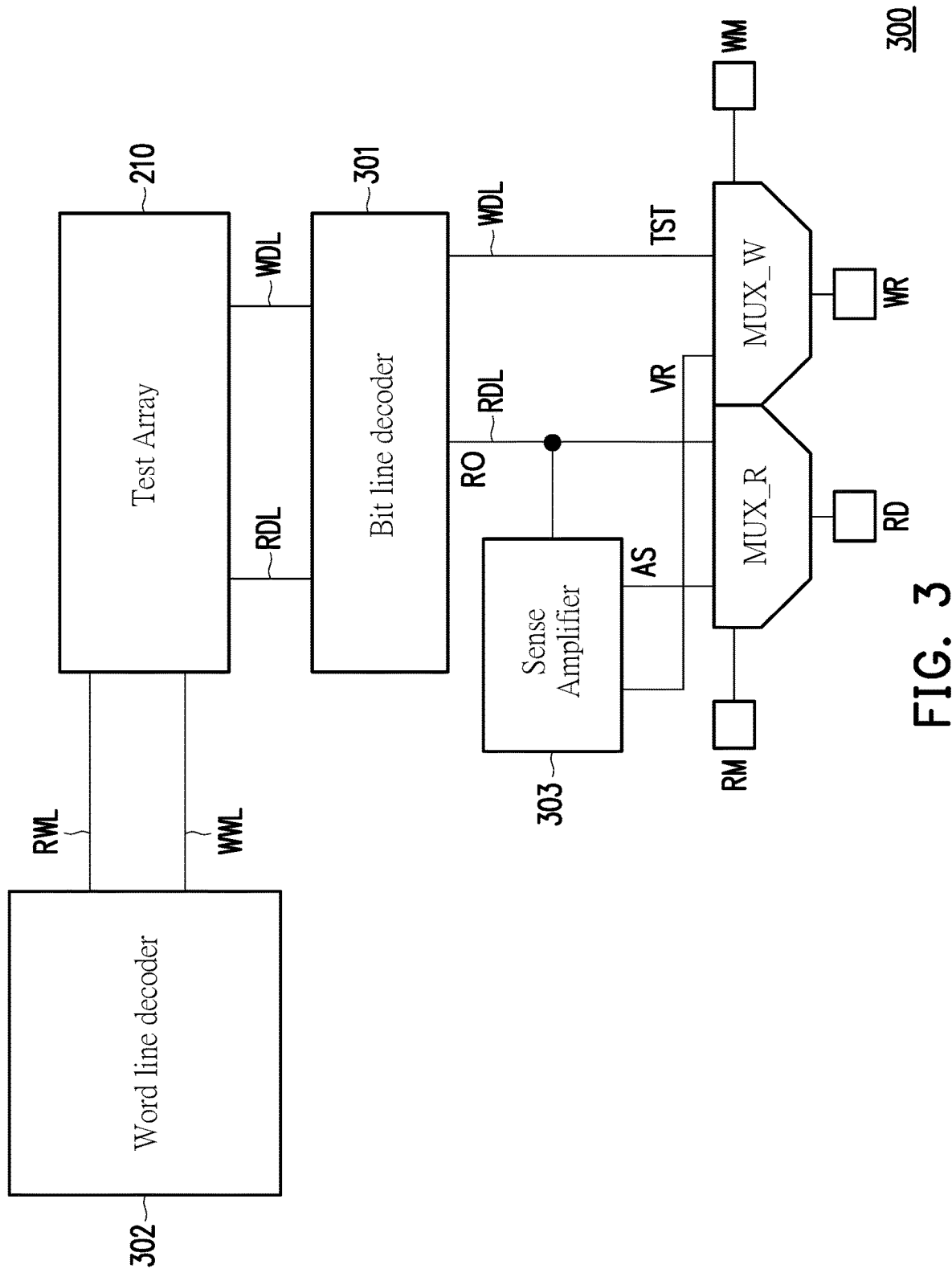
FIG. 3 is a schematic diagram of a memory test circuit in accordance with some embodiments of the present disclosure.

FIG. 3 is a schematic diagram of a memory test circuit in accordance with some embodiments of the present disclosure. Referring to FIG. 1 to FIG. 3, comparing to the memory test circuit 200 of FIG. 2, the memory test circuit 300 further includes a bit line decoder 301 and a word line decoder 302. In addition, in the embodiment, the memory test circuit 300 comprises a built-in sense amplifier, which is a sense amplifier 303. The bit line decoder 301 is electrically coupled to the test array 210 through at least one bit line (e.g., a write bit line WBL and/or a read bit line RBL). The word line decoder is electrically coupled to the test array 210 through at least one word line (e.g., a write word line WWL and/or a read word line RWL). It is noted that, the details of other parts of the memory test circuit 300 may be referred to the descriptions of the memory test circuit 200 of FIG. 2 to obtain sufficient teachings, suggestions, and implementation embodiments, while the details are not redundantly described seriatim herein.

In one embodiment, the word line decoder is configured to select a word line corresponding to the at least one of the plurality of test cells according to a first address signal (e.g., row selection signal). The bit line decoder is configured to select a bit line corresponding to the at least one of the plurality of test cells for writing data into or reading data from the at least one of the plurality of test cells according to a second address signal (e.g., column selection signal).

Referring to FIG. 1 and FIG. 3, since the memory test circuit 300 includes its own decoders (i.e., bit line decoder 301 and word line decoder 302), the cell characterization measurement of the test array 210 may be performed and the information access (writing/read) of the other memory cells MC of the memory array MA may be also performed at the same time.

Further, by setting the write measurement signal WM and the read measurement signal RM, the plurality of test cells of the test array 210 may also act as normal memory cells MC of the memory array MA. That is, the plurality of test cells of the test array 210 may provide not only a function of data storage, but also a function of cell characterization measurement. In other words, for the realization of the cell characterization measurement of the memory cells MC of the memory array MA, a huge amount of area is not needed and thereby saving the area overhead of the memory circuit 100.

Figure 4:
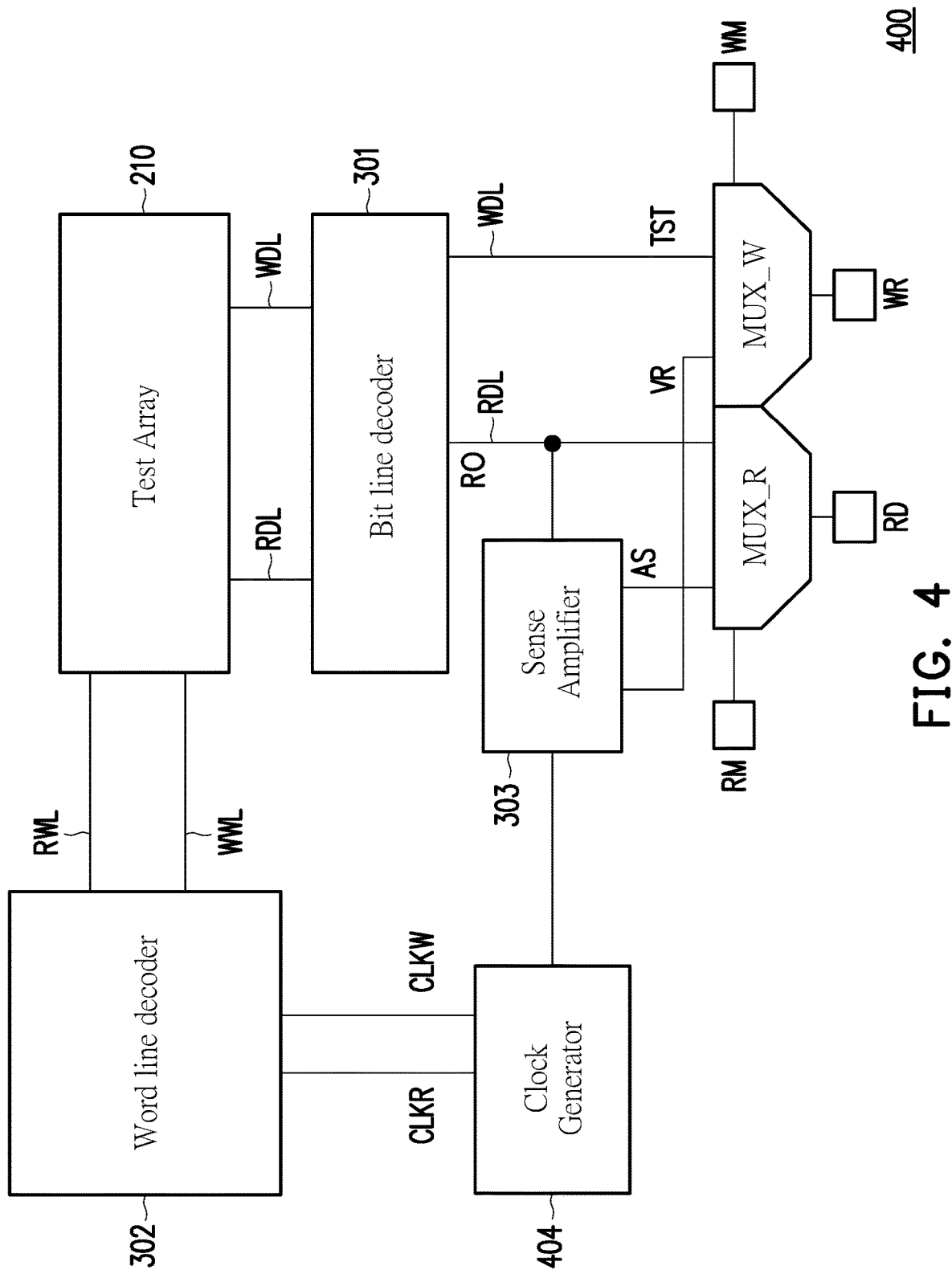
FIG. 4 is a schematic diagram of a memory test circuit in accordance with some embodiments of the present disclosure.

FIG. 4 is a schematic diagram of a memory test circuit in accordance with some embodiments of the present disclosure. Referring to FIG. 1 to FIG. 4, comparing to the memory test circuit 300 of FIG. 2, the memory test circuit 400 further includes a clock generator 404. The clock generator 404 is electrically coupled to the word line decoder 302 and the sense amplifier 303. It is noted that, the details of other parts of the memory test circuit 400 may be referred to the descriptions of the memory test circuit 200 of FIG. 2 and the memory test circuit 300 of FIG. 3 to obtain sufficient teachings, suggestions, and implementation embodiments, while the details are not redundantly described seriatim herein.

In one embodiment, the clock generator 404 is configured to generate a write clock signal CLKW and a read clock signal CLKR to the word line decoder 302 for selecting a word line (e.g., write word line WWL or read word line RWL) corresponding to the at least one of the plurality of test cells according to the first address signal (e.g., row selection signal). That is, the first address signal includes the write clock signal CLKW and the read clock signal CLKR. By setting the write clock signal CLKW and the read clock signal CLKR, the test cell of the test array 210 for the write operation and the read operation may be determine and the time period of the write operation and the read operation of the test array 210 may be determined.

In one embodiment, the clock generator 404 is configured to generate a select signal and a pre-charge signal to the sense amplifier 303 for selecting and pre-charging a bit line corresponding to the at least one of the plurality of test cells for write operation and the read operation the according to the second address signal (e.g., column selection signal). That is, the second address signal includes the select signal and the pre-charge signal. By setting the select signal and the pre-charge signal, the test cell of the test array 210 for the write operation and the read operation may be selected and the write operation and the read operation of the test cell of the test array 210 may be performed.

Referring to FIG. 1 and FIG. 4, since the memory test circuit 400 includes its own timer (i.e., clock generator 404), the cell characterization measurement of the test array 210 and the information access (writing/read) of the other memory cells MC of the memory array MA may be performed at different frequencies.

Further, by setting the write measurement signal WM and the read measurement signal RM, the plurality of test cells of the test array 210 may also act as normal memory cells MC of the memory array MA. That is, the plurality of test cells of the test array 210 may provide not only a function of data storage, but also a function of cell characterization measurement. In other words, for the realization of the cell characterization measurement of the memory cells MC of the memory array MA, a huge amount of area is not needed and thereby saving the area overhead of the memory circuit 100.

Figure 5:
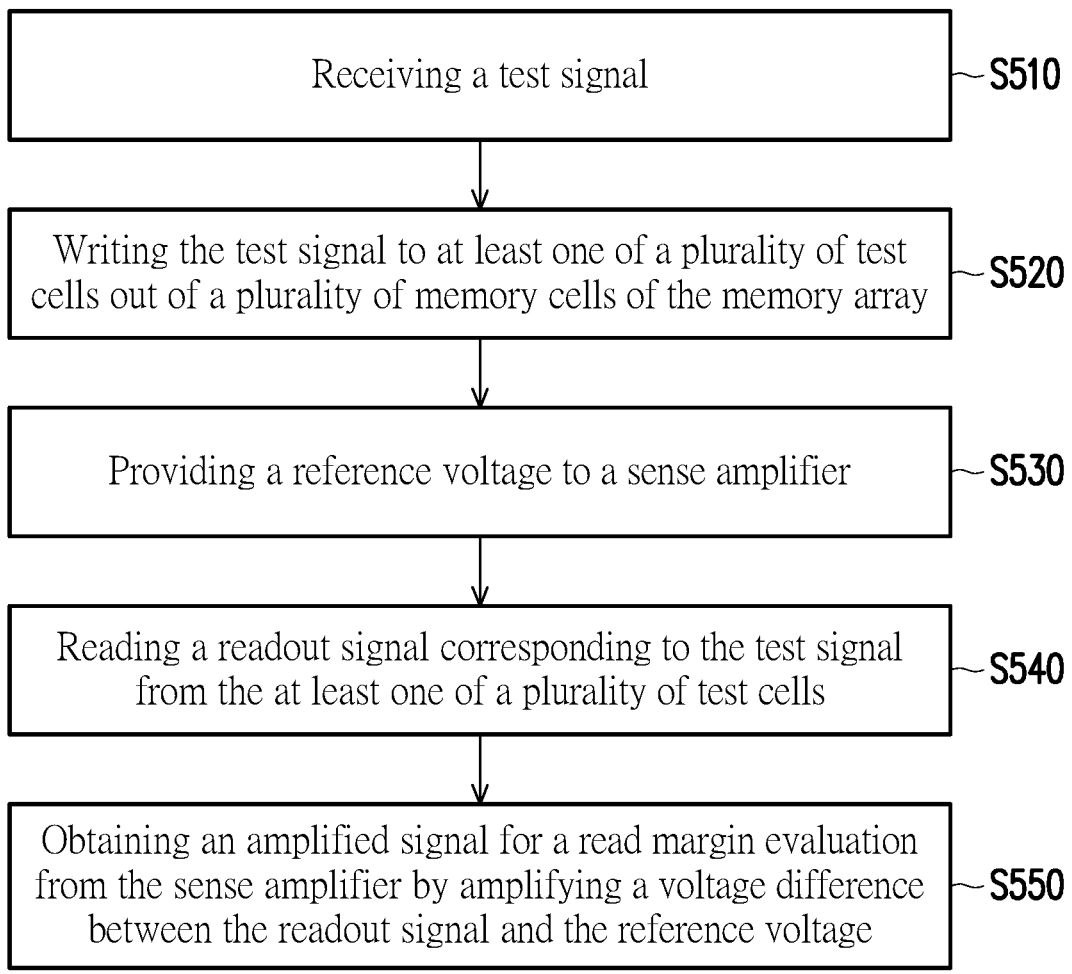
FIG. 5 is a schematic flowchart of a testing method of a memory array in accordance with some embodiments of the present disclosure.

FIG. 5 is a schematic flowchart of a testing method of a memory array in accordance with some embodiments of the present disclosure. Referring to FIG. 2 and FIG. 5, the testing method of the memory array comprising: step S510, step S520, step S530, step S540, and step S550.

In the step S510, the test signal is received by the write multiplexer MUX_W. In the step S520, the test signal TST is written to the at least one of the plurality of test cells out of the plurality of memory cells of the memory array write multiplexer MUX_W. In the step S530, the reference voltage VR is provided to a sense amplifier 203 by the write multiplexer MUX_W. In the step S540, the readout signal RO corresponding to the test signal TST is read from the at least one of the plurality of test cells, and is received by the sense amplifier 203. In the step S550, the amplified signal AS for a read margin evaluation is obtained from sense amplifier 203 by amplifying a voltage difference between the readout signal RO and the reference voltage VR by the read multiplexer MUX_R.

Therefore, the testing method allows that the plurality of test cells of the test array 210 may provide not only a function of data storage, but also a function of cell characterization measurement. In other words, for the realization of the cell characterization measurement of the memory cells MC of the memory array MA, a huge amount of area is not needed and thereby saving the area overhead of the memory circuit 100.

Based on the above, by disposing the test array, the write multiplexer and the read multiplexer in the memory array, the memory array may provide not only a function of data storage, but also a function of cell characterization measurement. In other words, for the realization of the cell characterization measurement of the memory cells of the memory array, a huge amount of area is not needed and thereby saving the area overhead of the memory device.

In one embodiment, the memory test circuit is disposed in a memory array. The memory test circuit includes: a test array, including a plurality of test cells out of a plurality of memory cells of the memory array; a write multiplexer, electrically coupled to the test array though a write data line and configured to selectively output one of a test signal and a reference voltage based on a write measurement signal, wherein the test signal is output to write into at least one of the plurality of test cells and the reference voltage is output to a sense amplifier; and a read multiplexer, electrically coupled to the test array though a read data line and configured to selectively receive and output one of a readout signal corresponding to the test signal and an amplified signal based on a read measurement signal, wherein the readout signal is read from the at least one of the plurality of test cells and the amplified signal is obtained for a read margin evaluation from the sense amplifier by amplifying a voltage difference between the readout signal and the reference voltage.

In a related embodiment, when the write measurement signal is at a low voltage level, the write multiplexer receives the test signal and output the test signal to the test array to write data into the at least one of the plurality of test cells of the test array, and when the write measurement signal is at a high voltage level, the write multiplexer outputs the reference voltage to the sense amplifier.

In a related embodiment, when the read measurement signal is at a low voltage level, the read multiplexer receives and outputs the readout signal from the at least one of the plurality of test cells of the test array, and when read measurement signal is at a high voltage level, the read multiplexer receives the amplified signal from the sense amplifier.

In a related embodiment, the read multiplexer includes a read terminal, a control terminal, and two output terminals, wherein the read terminal is configured to receive the test signal or the reference voltage, the control terminal is configured to receive the read measurement signal, and the two output terminals are configured to respectively output the test signal and the reference voltage.

In a related embodiment, the write multiplexer includes a write terminal, a control terminal, and two output terminals, wherein the write terminal is configured to output the readout signal or the amplified signal, the control terminal is configured to receive the write measurement signal, and the two output terminals are configured to respectively receive the readout signal and the amplified signal.

In a related embodiment, the memory test circuit further includes: a word line decoder, electrically coupled to the test array; and a bit line decoder, electrically coupled to the test array, wherein the word line decoder is configured to select a word line corresponding to the at least one of the plurality of test cells according to a first address signal, and the bit line decoder is configured to select a bit line corresponding to the at least one of the plurality of test cells for writing data into or reading data from the at least one of the plurality of test cells according to a second address signal.

In a related embodiment, the test array is electrically coupled to a word line decoder of the memory array and a bit line decoder of the memory array, wherein the word line decoder is configured to select a word line corresponding to the at least one of the plurality of test cells according to a first address signal, and the bit line decoder is configured to select a bit line corresponding to the at least one of the plurality of test cells for writing data into or reading data from the at least one of the plurality of test cells according to a second address signal.

In a related embodiment, the memory test circuit further includes: a clock generator, configured to generate a write clock signal and a read clock signal to a word line decoder for selecting a word line corresponding to the at least one of the plurality of test cells according to a first address signal, wherein the first address signal includes the write clock signal and a read clock signal.

In a related embodiment, the memory test circuit further includes: a clock generator, configured to generate a select signal and a pre-charge signal to a bit line decoder for selecting and pre-charging a bit line corresponding to the at least one of the plurality of test cells according to a first address signal, wherein the second address signal includes the select signal and the pre-charge signal.

In a related embodiment, the test signal is provided from a controller to the write multiplexer and the amplified signal is output from the read multiplexer to the controller for the read margin evaluation.

In another embodiment, the memory array includes: a memory array, including: a plurality of memory cells, and a memory test circuit, wherein the memory test circuit includes: a test array, including a plurality of test cells out of the plurality of memory cells of the memory array; a write multiplexer, electrically coupled to the test array though a write data line and configured to selectively output one of a test signal and a reference voltage based on a write measurement signal, wherein the test signal is output to write into at least one of the plurality of test cells and the reference voltage is output to a sense amplifier; and a read multiplexer, electrically coupled to the test array though a read data line and configured to selectively receive and output one of a readout signal corresponding to the test signal and an amplified signal based on a read measurement signal, wherein the readout signal is read from the at least one of the plurality of test cells and the amplified signal is obtained for a read margin evaluation from the sense amplifier by amplifying a voltage difference between the readout signal and the reference voltage.

In a related embodiment, when the write measurement signal is at a low voltage level, the write multiplexer receives the test signal and outputs the test signal to the test array to write data into the at least one of the plurality of test cells of the test array, and when the write measurement signal is at a high voltage level, the write multiplexer outputs the reference voltage to the sense amplifier.

In a related embodiment, when the read measurement signal is at a low voltage level, the read multiplexer receives and outputs the readout signal from the at least one of the plurality of test cells of the test array, and when read measurement signal is at a high voltage level, the read multiplexer receives the amplified signal from the sense amplifier.

In a related embodiment, the read multiplexer includes a read terminal, a control terminal, and two output terminals, wherein the read terminal is configured to receive the test signal or the reference voltage, the control terminal is configured to receive the read measurement signal, and the two output terminals are configured to respectively output the test signal and the reference voltage.

In a related embodiment, the write multiplexer includes a write terminal, a control terminal, and two output terminals, wherein the write terminal is configured to output the readout signal or the amplified signal, the control terminal is configured to receive the write measurement signal, and the two output terminals are configured to respectively receive the readout signal and the amplified signal.

In a related embodiment, the memory array further includes: a word line decoder, electrically coupled to the test array; and a bit line decoder, electrically coupled to the test array, wherein the word line decoder is configured to select a word line corresponding to the at least one of the plurality of test cells according to a first address signal, and the bit line decoder is configured to select a bit line corresponding to the at least one of the plurality of test cells for writing data into or reading data from the at least one of the plurality of test cells according to a second address signal.

In a related embodiment, the memory array further includes: a clock generator, configured to generate a write clock signal and a read clock signal to a word line decoder for selecting a word line corresponding to the at least one of the plurality of test cells according to a first address signal, wherein the first address signal includes the write clock signal and a read clock signal.

In a related embodiment, the memory array further includes: a clock generator, configured to generate a select signal and a pre-charge signal to a bit line decoder for selecting and pre-charging a bit line corresponding to the at least one of the plurality of test cells according to a first address signal, wherein the second address signal includes the select signal and the pre-charge signal In a related embodiment, the test signal is provided from a controller to the write multiplexer and the amplified signal is output from the read multiplexer to the controller for the read margin evaluation.

In yet another embodiment, the testing method of a memory array, including: receiving a test signal; writing the test signal to at least one of a plurality of test cells out of a plurality memory cells of the memory array; providing a reference voltage to a sense amplifier; reading a readout signal corresponding to the test signal from the at least one of a plurality of test cells; and obtaining an amplified signal from the sense amplifier by amplifying a voltage difference between the readout signal and the reference voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory test circuit, disposed in a memory array, wherein the memory test circuit comprises:
   a test array, comprising a plurality of test cells out of a plurality of memory cells of the memory array;
   a write multiplexer, electrically coupled to the test array though a write data line and configured to selectively output one of a test signal and a reference voltage based on a write measurement signal, wherein the test signal is output to write into at least one of the plurality of test cells and the reference voltage is output to a sense amplifier; and
   a read multiplexer, electrically coupled to the test array though a read data line and configured to selectively receive and output one of a readout signal corresponding to the test signal and an amplified signal based on a read measurement signal, wherein the readout signal is read from the at least one of the plurality of test cells and the amplified signal is obtained for a read margin evaluation from the sense amplifier by amplifying a voltage difference between the readout signal and the reference voltage.

2. The memory test circuit according to claim 1, wherein when the write measurement signal is at a low voltage level, the write multiplexer receives the test signal and output the test signal to the test array to write data into the at least one of the plurality of test cells of the test array, and
   when the write measurement signal is at a high voltage level, the write multiplexer outputs the reference voltage to the sense amplifier.

3. The memory test circuit according to claim 1, wherein when the read measurement signal is at a low voltage level, the read multiplexer receives and outputs the readout signal from the at least one of the plurality of test cells of the test array, and when read measurement signal is at a high voltage level, the read multiplexer receives the amplified signal from the sense amplifier.

4. The memory test circuit according to claim 1, wherein the read multiplexer comprises a read terminal, a control terminal, and two output terminals, wherein the read terminal is configured to receive the test signal or the reference voltage, the control terminal is configured to receive the read measurement signal, and the two output terminals are configured to respectively output the test signal and the reference voltage.

5. The memory test circuit according to claim 1, wherein the write multiplexer comprises a write terminal, a control terminal, and two output terminals, wherein the write terminal is configured to output the readout signal or the amplified signal, the control terminal is configured to receive the write measurement signal, and the two output terminals are configured to respectively receive the readout signal and the amplified signal.

6. The memory test circuit according to claim 1, further comprising:
a word line decoder, electrically coupled to the test array; and
a bit line decoder, electrically coupled to the test array,
wherein the word line decoder is configured to select a word line corresponding to the at least one of the plurality of test cells according to a first address signal, and the bit line decoder is configured to select a bit line corresponding to the at least one of the plurality of test cells for writing data into or reading data from the at least one of the plurality of test cells according to a second address signal.

7. The memory test circuit according to claim 1, wherein the test array is electrically coupled to a word line decoder of the memory array and a bit line decoder of the memory array,
wherein the word line decoder is configured to select a word line corresponding to the at least one of the plurality of test cells according to a first address signal, and the bit line decoder is configured to select a bit line corresponding to the at least one of the plurality of test cells for writing data into or reading data from the at least one of the plurality of test cells according to a second address signal.

8. The memory test circuit according to claim 1, further comprising
a clock generator, configured to generate a write clock signal and a read clock signal to a word line decoder for selecting a word line corresponding to the at least one of the plurality of test cells according to a first address signal,
wherein the first address signal comprises the write clock signal and the read clock signal.

9. The memory test circuit according to claim 1, further comprising
a clock generator, configured to generate a select signal and a pre-charge signal to the sense amplifier for selecting and pre-charging a bit line corresponding to the at least one of the plurality of test cells according to a second address signal,
wherein the second address signal comprises the select signal and the pre-charge signal.

10. The memory test circuit according to claim 1, wherein the test signal is provided from a controller to the write multiplexer and the amplified signal is output from the read multiplexer to the controller for the read margin evaluation.

11. A memory array, comprising:
a plurality of memory cells, and
a memory test circuit, wherein the memory test circuit comprises:
a test array, comprising a plurality of test cells out of the plurality of memory cells of the memory array;
a write multiplexer, electrically coupled to the test array though a write data line and configured to selectively output one of a test signal and a reference voltage based on a write measurement signal, wherein the test signal is output to write into at least one of the plurality of test cells and the reference voltage is output to a sense amplifier; and
a read multiplexer, electrically coupled to the test array though a read data line and configured to selectively receive and output one of a readout signal corresponding to the test signal and an amplified signal based on a read measurement signal, wherein the readout signal is read from the at least one of the plurality of test cells and the amplified signal is obtained for a read margin evaluation from the sense amplifier by amplifying a voltage difference between the readout signal and the reference voltage.

12. The memory array according to claim 11, wherein when the write measurement signal is at a low voltage level, the write multiplexer receives the test signal and output the test signal to the test array to write data into the at least one of the plurality of test cells of the test array, and
when the write measurement signal is at a high voltage level, the write multiplexer outputs the reference voltage to the sense amplifier.

13. The memory array according to claim 11, wherein when the read measurement signal is at a low voltage level, the read multiplexer receives and outputs the readout signal from the at least one of the plurality of test cells of the test array, and
when read measurement signal is at a high voltage level, the read multiplexer receives the amplified signal from the sense amplifier.

14. The memory array according to claim 11, wherein the read multiplexer comprises a read terminal, a control terminal, and two output terminals, wherein the read terminal is configured to receive the test signal or the reference voltage, the control terminal is configured to receive the read measurement signal, and the two output terminals are configured to respectively output the test signal and the reference voltage.

15. The memory array according to claim 11, wherein the write multiplexer comprises a write terminal, a control terminal, and two output terminals, wherein the write terminal is configured to output the readout signal or the amplified signal, the control terminal is configured to receive the write measurement signal, and the two output terminals are configured to respectively receive the readout signal and the amplified signal.

16. The memory array according to claim 11, further comprising:
a word line decoder, electrically coupled to the test array; and
a bit line decoder, electrically coupled to the test array,
wherein the word line decoder is configured to select a word line corresponding to the at least one of the plurality of test cells according to a first address signal, and the bit line decoder is configured to select a bit line corresponding to the at least one of the plurality of test cells for writing data into or reading data from the at least one of the plurality of test cells according to a second address signal.

17. The memory array according to claim 11, further comprising
a clock generator, configured to generate a write clock signal and a read clock signal to a word line decoder for selecting a word line corresponding to the at least one of the plurality of test cells according to a first address signal,
wherein the first address signal comprises the write clock signal and a read clock signal.

18. The memory array according to claim 11, further comprising
a clock generator, configured to generate a select signal and a pre-charge signal to the sense amplifier for selecting and pre-charging a bit line corresponding to the at least one of the plurality of test cells according to a second address signal,
wherein the second address signal comprises the select signal and the pre-charge signal.

19. The memory array according to claim 11, wherein the test signal is provided from a controller to the write multiplexer and the amplified signal is output from the read multiplexer to the controller for the read margin evaluation.

20. A testing method of a memory array, comprising:
receiving a test signal;
selectively outputting, through a write multiplexer, one of the test signal and a reference voltage based on a write measurement signal, wherein the test signal is output to write into at least one of a plurality of test cells out of a plurality memory cells of the memory array and the reference voltage is output to a sense amplifier; and
selectively reading, through a read multiplexer, one of a readout signal corresponding to the test signal and an amplified signal based on a read measurement signal, wherein the readout signal is read from the at least one of a plurality of test cells and the amplified signal is obtained for a read margin evaluation from the sense amplifier by amplifying a voltage difference between the readout signal and the reference voltage.

* * * * *